United States Patent [19]
Hendrickson et al.

[11] Patent Number: 6,055,281
[45] Date of Patent: Apr. 25, 2000

[54] PASSBAND DQPSK DETECTOR FOR A DIGITAL COMMUNICATIONS RECEIVER

[75] Inventors: Alan Hendrickson; Paul Schnizlein, both of Austin, Tex.

[73] Assignee: DSP Group, Inc., Santa Clara, Calif.

[21] Appl. No.: 08/975,142

[22] Filed: Nov. 20, 1997

Related U.S. Application Data

[60] Provisional application No. 60/031,350, Nov. 21, 1996.

[51] Int. Cl.[7] .................................................. H04L 27/22
[52] U.S. Cl. .......................... 375/329; 375/324; 329/304
[58] Field of Search ........................... 708/314; 375/707, 375/350, 329, 324, 340; 329/304

[56] References Cited

U.S. PATENT DOCUMENTS

| | | |
|---|---|---|
| 4,243,941 | 1/1981 | Zdunek . |
| 4,896,336 | 1/1990 | Henley et al. . |
| 5,426,669 | 6/1995 | Yamamoto et al. . |
| 5,687,190 | 11/1997 | Tsao ........................................ 375/207 |
| 5,930,267 | 7/1999 | Daneshrad et al. ...................... 370/509 |

FOREIGN PATENT DOCUMENTS

| | | |
|---|---|---|
| 0 008 491 | 3/1980 | European Pat. Off. . |
| 0 320 058 A2 | 6/1989 | European Pat. Off. . |
| 0 576 826 A2 | 1/1994 | European Pat. Off. . |
| WO 96/12361 | 4/1996 | WIPO . |

OTHER PUBLICATIONS

XP002062128 Serizawa, "An Adaptive Carrier Tracking Loop For Digital Satellite Mobile Communications," IEEE Conference on Communications, vol. 3, Jun. 7–10, 1987, Seattle, Washington, pp. 1754–1760.

XP000269407 Uchishima, et al, "Burst DSP Demodulator For Low EB/No Operation,", Communications—Rising to the Heights, Denver, Jun. 23–26, 1991, vol. 1, Institute of Electrical and Electronics Engineers, pp. 226–230.

XP000358888 Hansen, et al, "VLSI Digital PSK Demodulator for Space Communication," European Transactions on Telecommunications and Related Technologies, vol. 4, Jan. 1993, pp. 43–52.

International Search Report for PCT/US 97/21468 dated Apr. 21, 1998.

Sklar, B., "*Digital Communications; Fundamentals and Applications*," PTR Prentice Hall, Englewood Cliffs, New Jersey, 1988, pp.552.

*Primary Examiner*—Temesghen Ghebretinsae
*Assistant Examiner*—Kevin M Burd
*Attorney, Agent, or Firm*—Conley, Rose & Tayon P.C.; Jeffrey C. Hood; Cyrus F. Bharucha

[57] ABSTRACT

A digital communications DQPSK passband detector having a matched filter, a differential decoder, and a slicer that use elementary circuit components. In the matched filter, recovered carrier reference signals are fed along with the received signal to a pair of XNOR gates. This arrangement effectively results in a multiplication operation without any complex circuit elements. The outputs of the XNOR gates control the direction of counting of a pair of binary counters that generate correlated values of the I and Q components in the received signal. Thus, the integrate/dump circuits of a conventional matched filter are replaced with simpler digital counters. A digital differential decoder to extract the phase difference information between two consecutive received symbols is built from a network of delay elements, multipliers, and adders to recover the phase data. The digital differential decoder produces a digital complex-signal output that can be quantized in a digital slicer to decode the plurality of binary bits transmitted through the data symbols. All these operations are performed on digital signals with basic digital circuit elements, thus resulting in a repeatable robust receiver design without complex hardware components.

23 Claims, 5 Drawing Sheets

PASSBAND DQPSK DETECTOR FOR A DIGITAL COMMUNICATIONS RECEIVER

PRIORITY

This application claims the benefit of priority of U.S. Provisional Application No. 60/031350, titled "Spread Spectrum Cordless Telephone System and Method" and filed Nov. 21, 1996, whose inventors were Alan Hendrickson, Paul Schnizlein, Stephen T. Janesch, and Ed Bell.

BACKGROUND OF THE INVENTION

1. Field of the Invention

This invention relates to digital communication and, more particularly, to a digital matched filter in a digital baseband digital symbol detector.

2. Description of the Related Art

Quadriphase shift keying (QPSK) is a quadrature amplitude modulation (QAM) technique of phase modulating the digital information onto a carrier signal. QPSK communications systems are generally known in the art. In these systems, a transmitter determines the frequency and phase of the unmodulated carrier wave. The transmitter associate two bits of information into a symbol $a_k$ and encodes the symbol into one of four QPSK alphabet elements to form a complex-valued line-coded symbol $s_k$ where the subscript k indicates a sample index in a discrete-time sequence which can be written:

$$\{s_k\} = \sum_k s_k \delta(t - kT)$$

where $s_k = e^{j\theta(k)}$ and $\theta(k) \in \{\pi/4, 3\pi/4, 5\pi/4, 7\pi/4\}$.

Conversion of this discrete time sequence, which is defined only at instants t=kT, to the continuous time domain necessitates application of a filter with impulse response g(t), called the pulse shape. The output of the pulse shape filter is the convolution of $\{S_k\}$ with g(t) and is known as the baseband pulse-shaped information signal, s(t)

$$s(t) = \sum_k s_k g(t - kT)$$

In radio applications, s(t) is modulated on a complex sinusoidal carrier at a radio frequency in order to effectively radiate in the air medium. The modulation operation can be written mathematically as $$x(t) = \sqrt{2} \, \mathrm{Re}\{s(t)e^{j\omega_{RF}t}\}$$

In practice, the operation is typically realized as $$x(t) = \sqrt{2} \, (\mathrm{Re}\{s(t)\}\cos\omega_{RF}t - \mathrm{Im}\{s(t)\}\sin\omega_{RF}t)$$

Furthermore, the pulse shape filter g(t) is typically implemented as a unit pulse $$g(t) = \prod(t) = \begin{cases} 1: & -\frac{T}{2} < t < \frac{T}{2} \\ 0: & \text{else} \end{cases}$$

For this case, $$s(t) = \sum_k s_k g(t - kT) = \sum_k e^{j\theta(k)} \prod(t - kT)$$

Therefore, for the duration of each successive symbol, s(t) remains a complex constant $e^{j\theta(k)}$ and x(t) reduces to $$x(t) = \sqrt{2} \cos(\omega_{RF}t + \theta(t)),$$

where the continuous-time symbolphase θ(t) is defined as follows.

$$\theta(t) = \sum_k \theta(k) \prod(t - kT)$$

It can be seen therefore that the transmitted signal is a real-valued sinusoid at the RF carrier frequency at one of four discrete information-bearing phases.

Demodulation at the receiver is mathematically described as $$y(t) = \sqrt{2} \, x(t)e^{-j\omega_{RF}t} \qquad \text{(Equation 1)}$$

followed by a low-pass filter to eliminate the high-frequency products. The filter output is then $y(t)=e^{j\theta(k)}$ for the duration of each successive symbol and the symbol sequence $\{a_k\}$ can be decoded therefrom.

Practical implementation of Equation 1 is made difficult by the requirement to multiply by a complex sinusoid of predetermined frequency and phase. Known as a recovered coherent carrier, this carrier must match the frequency and phase of the transmitted carrier. The requirement is relaxed in the technique of differential QPSK (DQPSK). In DQPSK, the transmitted data are differentially encoded, that is, they are represented by the difference in phase between two successive symbols. This differential encoding affects only the mapping of the symbols $a_k$ into line-coded symbols $s_k$, by applying the revised mapping rule $$s_k = e^{j(\sum_{n=0}^{k} \theta(n))}$$

in the development of the transmitter model above. The measured phase difference between any two successive receive symbols identifies the information element θ(k) regardless of any arbitrary fixed phase offset in the recovered carrier used for downconversion. Therefore, using the differential technique, the receiver does not need the absolute phase of the carrier to decode the transmitted symbols. In fact, small errors in the frequency of the recovered carrier can also be tolerated in such a system when it results in a phase shift with respect to the carrier which is small relative the size of θ(k).

Further technological difficulties with direct implementation of Equation 1 encourage a multi-step downconversion, rather than a single direct downconversion to baseband. The typical receiver first downconverts the modulated RF carrier to an intermediate frequency (IF) and then again to baseband. The first downconversion output x'(t) resulting from downconverting x(t) from its RF carrier to an intermediate frequency $\omega_{IF}$ can be written $$x'(t) = \sqrt{2} \cos(\omega_{IF}t + \theta(t))$$

The IF signal x'(t) can be subsequently downconverted to baseband. For accurate detection, the frequencies used in the downconversion must be such that the net frequency shift due to downconversion operations closely approximates the transmitter RF carrier.

The absolute frequency of the RF carrier at the receiver input will vary due to time-varying conditions such as impedance changes in the transmitter oscillator load and temperature changes or aging affecting the oscillator's frequency. Therefore, oscillators used in the receiver for downconversion generally require some control to track these frequency variations. A circuit designed to perform these controls so as to accurately downconvert the signal is known in the art as a carrier recovery loop.

After downconversion to baseband, the first stage in a typical detector is a matched filter. The matched filter maximizes signal-to-noise power ratio (SNR) at its output for a given transmitted pulse shape. The maximization is optimally achieved when the impulse response of the matched filter is the mirror image (rotated on the t=0 axis) of the complex conjugate of the expected received symbol pulse shape, which is defined to be the transmitted pulse shape g(t) distorted by the communication channel. Thus the impulse response f(t) of an ideal matched filter can be given by the following equation:

$$f^*(-t) = c \cdot g(t) * b(t)$$

where b(t) represents the channel characteristics and c is an arbitrary constant. It is well-known in the art that this impulse response results in a filter with a maximum output SNR for any given pulse shape. In many circumstances, the channel characteristic can adequately be modeled by $c \cdot b(t) = 1$, and in the case of interest, g(t) is $\Pi(t)$ which is real and symmetric about t=0, so f(t) can be reduced to $$f(t) = \Pi(t).$$

The output of the downconversion from IF and subsequent filtering can be described by z(t):

$$z(t) = (x'(t)e^{-j\omega_{IF}t}) * \sqrt{2} f(t) \quad \text{(Equation 2)}$$

It is further well known in the art that after the filtering and downconversion operations, a symbol-rate sampler is conventionally used to translate the continuous time received signal into a discrete-time signal. When f(t) is the special case under consideration f(t)=$\Pi$(t), the convolution product z(t) and its discrete-time equivalent z(k) are related by:

$$z(k) = z(t)|_{t=kT} = \sqrt{2} \int_{kT-T/2}^{kT+T/2} x'(t)e^{-j\omega_{IF}t} dt \quad \text{(Equation 3)}$$

To complete the digital receiver a quantizing and decoding device (slicer) typically follows, converting the baseband, filtered, sampled received signal first to a line-coded symbol $\hat{s}_k$ and then mapping $\hat{s}_k$ to a two-bit binary symbol $\hat{a}_k$.

Equation 2 requires two multiplication operations, one for the real part of the integrand and one for the imaginary part of the integrand. Analog multipliers represent a technical manufacturing challenge and add some noise or distortion, resulting in performance loss. Therefore, a digital matched filter is desired which avoids the pitfalls associated with circuit designs implementing analog multipliers. A matched filter digitally implementing a multiplier function without a conventional analog multiplier would result in a considerably more repeatable fabrication.

Further, analog implementation of an integrator suffers from low tolerances in the manufacturing process; this is especially true in monolithic integrated circuits. An analog integrator in one circuit may have a very different time constant than an integrator in another circuit manufactured by the same process. Unlike integration performed by analog components on integrated circuits, digital integration is a precisely controllable function determined by circuit design rather than the physical features of its components. All digital integrators produced by the same process have essentially the same performance characteristics.

As digital integrators are more flexible than their analog counterparts, it is desirable to have a matched filter that performs integration through easily available digital circuits. While an analog integrator requires a selection of reference resistors and/or capacitors to provide multiple time constants, a digital integrator can be easily programmed to change its function. Hence, an all-digital implementation of a matched filter results in reduced system complexity, but improved performance and flexibility of operation.

SUMMARY OF THE INVENTION

An all-digital implementation of a passband DQPSK detector, as discussed above, is achieved with a digital matched filter, differential decoder and slicer. The all-digital implementation is made feasible in practice by the application of an IF limiter to the received signal x'(t) so that the output x''(t) of the limiter is a 2-level signal representing the arithmetic sign of x'(t) only. The IF limiter is a non-linear device the output of which is discrete-valued but continuous in time. The quantization in amplitude benefits the invention by dramatically reducing the complexity of computation. The continuous-time character allows inference of phase to any arbitrary resolution.

The implementation presupposes the existence of a supplemental circuit which recovers the frequency of the IF carrier and a second supplemental circuit which determines the location in time of symbol boundaries within x''(t). The preferred embodiment of the invention comprises a receiver comprising a passband DQPSK detector and a digital carrier recovery loop that tracks the frequency of the IF carrier of the received signal and supplies a replica of the complex carrier, having at least a nearly matching frequency, to the matched filter. The carrier recovery loop is implemented with a digitally-controlled digital oscillator which employs a digital phase error detector. A digitally controlled digital oscillator is a finite state machine in which the current state represents the modulo-$2\pi$ phase of the oscillator output. The state (i.e. the phase) is advanced by a fixed-period sampling clock, generally assumed to be much greater than the desired frequency of oscillation. The resolution of the phase is limited by the width, in bits, of the state variable. For example, 360 possible states can represent 1 degree of resolution whereas 3600 states can represent 0.1 degree resolution. The phase error detector modulates the increment in the state variable according to a measured error criterion and does not produce an error when the incoming signal matches in phase to any $\pi/2$ shift of the recovered carrier in order to reject the modulated information signal. The number of phase states in the preferred embodiment is such that 90 degrees is exactly described by a four times an integral number of states, so that the two most significant bits of the state variable represent the phase quadrant. These two bits accurately reflect the arithmetic signs of the real and imaginary components of the recovered complex carrier (i.e. the cosine and sine of the phase angle) allowing the circuit to deliver to the matched filter an accurate representation of the complex carrier on two binary signals.

The preferred embodiment further comprises a symbol clock recovery circuit, the purpose of which is to define timing for the matched filter integration period. In the preferred embodiment of a direct sequence spread spectrum system, the symbol timing can be determined from a receive signal strength indicator (RSSI) representing the correlation of a locally generated pseudonoise (PN) sequence with the PN sequence of the transmitting device. The RSSI is a function of the PN correlation such that it is maximized when the sequences align in time. The preferred embodiment constrains the symbol timing to be derived from the PN sequence timing in the transmitter so that the receiver symbol clock recovery circuit can likewise derive the symbol timing from the timing of the locally generated PN sequence. The symbol clock generation circuit modulates the timing of the PN sequence so as to maximize the RSSI, thereby establishing maximum PN correlation, and consequently recovering symbol timing.

The matched filter simultaneously performs the operations of downconversion, matched filtering, and sampling using commonly available digital circuitry. Its inputs comprise the following six signals:

1) RX_IF, a binary representation of the amplitude-limited passband PSK signal x'(t) downconverted to a low IF;
2) REF_I, a binary representation of the arithmetic sign of the cosine of the recovered carrier, delivered by the carrier recovery loop;
3) REF_Q, a binary representation of the arithmetic sign of the sine of the recovered carrier, delivered by the carrier recovery loop;
4) MASTER CLOCK, a high-frequency sampling clock;
5) SYMBOL CLOCK, a periodic pulse with a pulse-width of one MASTER CLOCK sample period coincident with the symbol boundary and recurring at intervals of the symbol period, delivered by the symbol clock recovery circuit; and
6) EVAL_WINDOW, a periodic time-windowing pulse, with a variable pulse width, recurring at intervals of the symbol period, delivered by the symbol clock recovery circuit.

The RX_IF signal and REF_I signal are effectively multiplied using an XNOR logic gate. The result drives the direction control input of a binary up/down counter, so as to increment the counter on sampling clock events when RX_IF matched REF_I and to decrement it on sampling clock events otherwise. The counter is further controlled by the SYMBOL CLOCK input so as to clear the counter to zero when the pulse is true, and by the EVAL_WINDOW signal so as to inhibit counting when the pulse is false. The multi-bit value accumulated in the counter during a given symbol period is stored in a latch upon the occurrence of the SYMBOL CLOCK pulse and represents the real-valued part of the filtered, sampled baseband signal.

An identical filter circuit is implemented using the RX_IF and REF_Q inputs to implement the imaginary-valued part of the filtered, sampled baseband signal.

The EVAL_WINDOW signal is symmetric about the center of the symbol interval. It is true for approximately 83% of the symbol interval around the symbol center and is false around the symbol boundaries. It exists to modify the correlator pulse-shape so as to selectively eliminate signal and noise during moments during which noise enhancement is likely in a system employing a limiter and to ensure that the basis vectors of the receive signal space are approximately orthogonal, as will be explained in detail later. In such a system, when the phase of the modulated carrier suddenly changes due to the instantaneous change in the content of the modulated data at the symbol boundary, the bandwidth limitations of the radio circuitry cause the envelope of the modulated carrier to collapse temporarily. When the signal into the limiter collapses, the limiter output is dominated by noise. Therefore, the EVAL_WINDOW signal selectively filters in the time domain input which is likely to be noisy. The width of the EVAL_WINDOW in the preferred embodiment is programmable in order to allow flexibility in the design.

The implementation of the matched filter is innovative in its approach. First, rather than downconverting the received signal to baseband by multiplication by a complex sinusoid and performing a complex baseband matched filter, or conversely, upconverting the matched filter impulse response, applying it to the bandpass signal, and subsequently down converting, the approach taken in this implementation is to predistort the pulse-shape of the filter by multiplication with a signal emulating the non-linearity of the IF limiter and correlating against this predistorted carrier. This approach maximizes the measured correlation of the signal to the carrier.

Second, the entire operation occurs in discrete time with no required continuous time calculations. The benefit of this feature is that no analog circuitry is required. Technological requirements for analog circuitry in integrated semiconductor devices is frequently in conflict with the requirements of digital circuitry, so that inexpensive readily available digital semiconductor processes might not be applicable to analog devices. Also analog circuits inherently sacrifice performance to noise and distortion which can be eliminated in digital circuitry. Further, the digital implementation eliminates the issue of balancing the amplitudes of the real- and imaginary-valued filter impulse responses, which can be a problem in paired analog filters.

Third, the matched filter is tolerant of any arbitrary phase shift in the recovered carrier signals relative to the phase of the IF carrier. The two outputs of the filter can be viewed as the decomposition of the received symbol into two orthonormal vectors representing the real and imaginary axes of the complex plane.

The differential decoder produces a complex-valued output indicating the phase difference between any two successive symbols. Its inputs are the complex-valued output of the matched filter, a symbol-rate sampling clock, and a high frequency clock for performing digital calculations. The differential decoder performs the multiplication of the current matched filter output sample with the complex conjugate of the previous sampler. Ideally, any given sample of the differential decoder output lies on one of the axes of the complex plane at a normalized distance of 1 from the origin. This is because the magnitude of two ideal samples multiplied are identical and normalized to 1 and the phase difference between them is a multiple of $\pi/2$. For instructional purposes, the complex resultant may be translated into polar coordinates to directly specify its magnitude and phase, but the translation is unnecessary in the preferred embodiment.

The slicer quantizes the phase of the differential decoder resultant into one of four discrete values in a innovative and efficient way. It first establishes a Cartesian plane wherein the orthogonal axes represent the vector bases for the real and imaginary components of the complex plane. It establishes four ideal constellation points configured symmetrically about the origin, each point located on an axis with a normalized distance of 1 from the origin. It further establishes four quadrants bounded by the relation $\phi=(n\pi/2+\pi/4)$, where $\phi$ is the phase angle in the polar representation of the complex plane and n=0,1,2,3. It determines in which quadrant the differential decoder resultant maps. All differential decoder resultants mapping into the quadrant $-\pi/4<\pi<\pi/4$ are quantized to 0, all mapping into the quadrant $\pi/4<\phi<3\pi/4$ are quantized to $\pi/2$, all mapping into the quadrant $3\pi/4<\phi<5\pi/4$ are quantized to $3\pi/2$, and all mapping into the quadrant $5\pi/4<\phi<\pi/4$ are quantized to $-\pi/2$. The quantized result is represented in a 2-bit code. The mapping of the quantization result to the 2-bit code is performed so as to perform the inverse of the function performed in the transmitter line coder. The 2-bit code therefore is the recovered symbol. The two bits of the each successive recovered symbol are then driven out of the slicer sequentially to reproduce the transmitted binary data stream.

BRIEF DESCRIPTION OF THE DRAWINGS

Other objects and advantages of the invention will become apparent upon reading the following detailed description and upon reference to the accompanying drawings in which.

DESCRIPTION OF THE PREFERRED EMBODIMENTS

The following patents and patent applications are related subject matter to the preferred embodiments of the present invention:

U.S. Provisional Application No. 60/031350 (docket # 5000-87300/TT1797), titled "Spread Spectrum Cordless Telephone System and Method" and filed Nov. 21, 1996, whose inventors are Alan Hendrickson, Paul Schnizlein, Stephen T. Janesch, and Ed Bell;

U.S. Application No. 08/968,030, U.S. Pat. No. 5,966,416, titled "Verification of PN Synchronization in a Spread-Spectrum Communications Receiver" and filed Nov. 12, 1997, whose inventor is Alan Hendrickson;

U.S. Application No. 08/974,966, U.S. Pat. No. 5,974,584, titled "Parity Checking in a Real-Time Digital Communications System" and filed Nov. 20, 1997, whose inventors are Alan Hendrickson and Paul Schnizlein;

U.S. Application No. 08/976,175, titled "Timing Recovery for a Pseudo-Random Noise Sequence in a Direct Sequence Spread Spectrum Communications System" and filed Nov. 21, 1997, whose inventors are Alan Hendrickson and Ken M. Tallo;

U.S. Application No. 08/968,202, titled "Phase Detector for Carrier Recovery in a DQPSK Receiver" and filed Nov. 12, 1997, whose inventors are Stephen T. Janesch, Alan Hendrickson, and Paul Schnizlein;

U.S. Application No. 09/078,225, titled "Symbol-Quality Evaluation in a Digital Communications Receiver" and filed May 13, 1998, whose inventor is Alan Hendrickson;

U.S. Application No. 08/968,028, titled "A Programmable Loop Filter for Carrier Recovery in a Radio Receiver" and filed Nov. 12, 1997, whose inventors are Stephen T. Janesch and Paul Schnizlein;

U.S. Application No. 08/968,029, titled "A Carrier-Recovery Loop with Stored Initialization in a Radio Receiver" and filed Nov. 12, 1997, whose inventors are Stephen T. Janesch, Paul Schnizlein, and Ed Bell;

U.S. Application No. 09/078,145, U.S. Pat. No. 5,940,435, titled "A Method for Compensating Filtering Delays in a Spread-Spectrum Receiver" and filed May 13, 1998, whose inventor is Alan Hendrickson;

U.S. Application No. 09/148,268, titled "Frame Synchronization in a Digital Communication System" and filed Sep. 4,1998, whose inventor is Alan Hendrickson;

U.S. Application No. 09/082,748, titled "System and Method for Down-Conversion of Received Signal to an Intermediate Frequency for DSP Processing" and filed May 21, 1998, whose inventors are Stephen T. Janesch, Paul Schnizlein, Alan Hendrickson, and Ed Bell.

Figure 1:
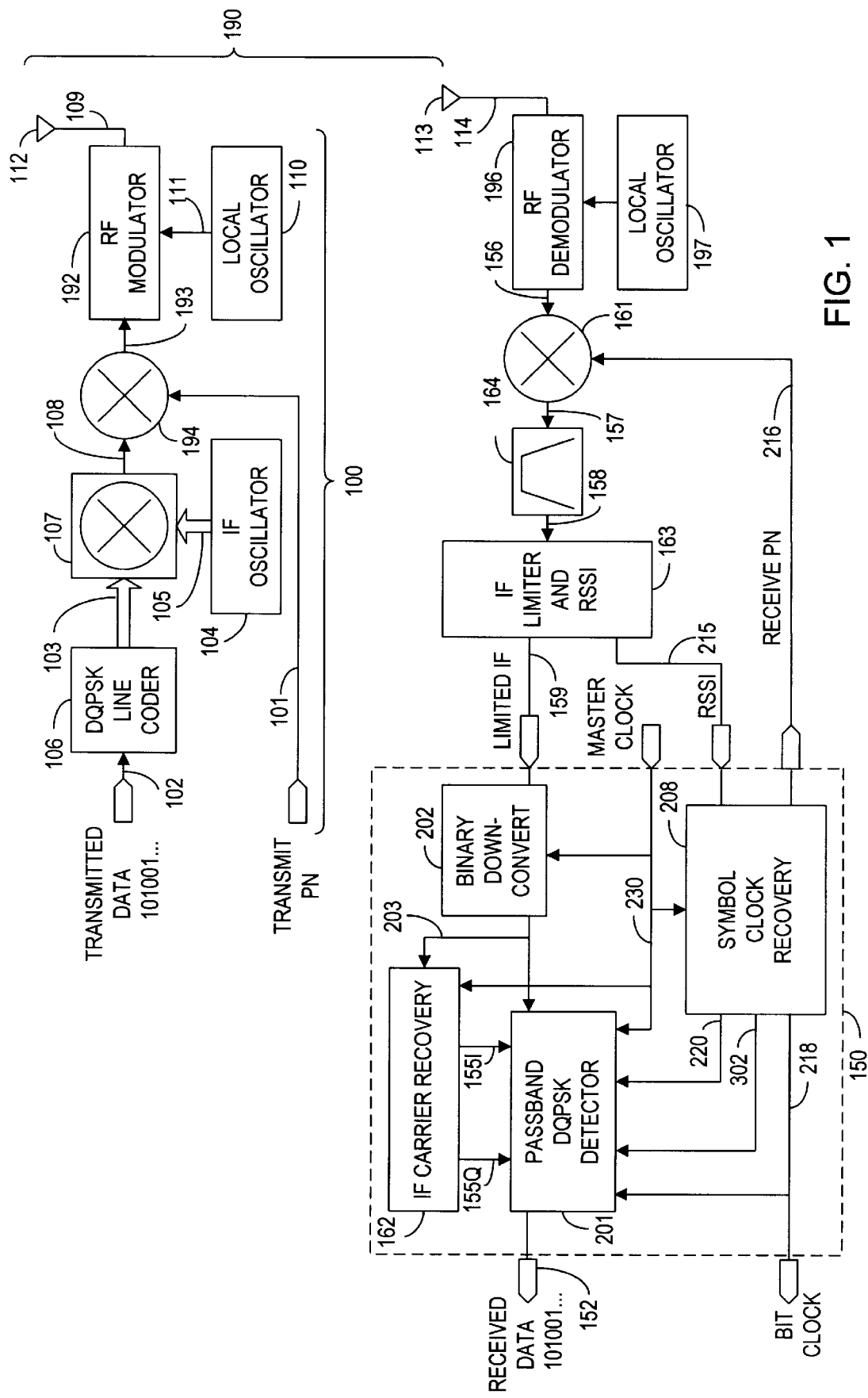
FIG. 1 is a schematic view of a DQPSK communication system.

FIG. 1—Communication System

FIG. 1 is a simplified schematic of a differential quadriphase shift keying (DQPSK) communication system that comprises at least one transmitter 100 and one receiver having a digital passband DQPSK detector 201 of the present invention for the communication of data. As described below, this passband DQPSK detector 201 comprises several components with novel features. In the transmitter 100, digital data 102 are provided to a DQPSK line coder 106. An intermediate frequency (IF) oscillator 104 generates a complex sinusoidal carrier wave 105 for the complex mixer 107. The digital data 102 are encoded on the complex baseband signal 103 by the DQPSK line coder 106, then upconverted to the intermediate frequency IFI by multiplication by the complex carrier 105 in the complex mixer 107. The DQPSK-modulated IF carrier 108 can be described as a tone at the carrier frequency with one of four discrete phases, each separated by an integral multiple of $\pi/2$ and remaining constant during any given symbol duration. Each symbol persists for a duration of time T. The differences in phase angle between successive symbols represent the transmitted data 102. Since there are four possible carrier phase values, each phase value represents two bits of transmitted data. The frequency of the IF carrier 105 is determined by the IF oscillator 104.

The spreading mixer 194 multiplies the DQPSK-modulated IF carrier by the transmit PN signal 101 to produce the spread modulated IF carrier 193. The transmit PN signal 101 is a repetitive pseudorandom sequence with values of +1 and −1. The signal 193 is a direct sequence spread-spectrum signal. The spread modulated IF carrier 193 is upconverted to radio frequency (RF) by the RF modulator 192. The RF modulator 192 multiplies the spread modulated IF carrier 193 by a radio frequency tone 111, eliminates undesirable mixing products, and provides power amplification in order to generate a modulated RF carrier 109 suitable for transmission. The frequency of the local oscillator 110 determines the frequency of the modulated RF carrier 109 through normal operation of the RF modulator 192, well-known in the art.

The modulated RF carrier 109 is efficiently radiated into the transmission medium 190 by the transmitting antenna 112 and is coupled into the receiver RF demodulator 196 by means of the receiving antenna 113.

The RF demodulator 196 amplifies received signals falling within a selected bandwidth and downconverts the result to an intermediate frequency determined by the frequency of the local oscillator 197. The frequency of the local oscillator 197 is specified so that the downconversion of the received RF modulated carrier 114 results in a spread modulated IF carrier 156 at some convenient of desirable frequency, for example 10.7 MHz. If the local oscillators 110 and 197 are constrained to oscillate at substantially the same frequency, then the frequency of the received spread modulated IF carrier 156 is substantially the same as that of the transmitted modulated carrier 108.

The despreading mixer 161 multiplies the spread modulated IF carrier 156 by the receive pseudonoise (PN) signal 216. The receive PN signal is a predetermined binary sequence matching the binary sequence conducted by the transmit PN signal 101. The phase of the sequence on the receive PN signal 216 is controlled by the symbol clock recovery block 208 to match the phase of the transmit PN signal 101. When the receive PN signal 216 is thus aligned, the despreading mixer 161 performs the inverse function of the spreading mixer 194, and the despread modulated IF carrier 157 is substantially the same as the DQPSK-modulated IF carrier 108 in the transmitter.

The bandpass filter 164 rejects undesirable spectral content resulting from the imperfect phase alignment of the two PN signals 101 and 216 as well as noise components falling outside the passband of the filter 164. The output of the bandpass filter 164 is the received modulated IF carrier 158.

Under ideal conditions, the received modulated IF carrier 158 would be an exact replica of the DQPSK-modulated IF carrier 108. In practice, there may be differences between the two signals due to degradation suffered in the communication channel.

The IF limiter and RSSI circuit 163 removes amplitude modulation from the received modulated IF carrier 158 in a fashion well-known in the art. The limiter output 159 is a binary signal with two discrete voltage levels representing the instantaneous polarity of the modulated IF carrier 158.

Another signal generated by the IF limiter and RSSI circuit 163 is the RSSI output 215. This signal 215 is an analog signal proportional to the logarithm of the power of the received modulated IF carrier 158. This power is in turn directly proportional to the correlation of the receive PN signal 216 to the transmit PN signal 101. The RSSI output 215 and the limiter output 159 are both provided to the passband DQPSK receiver 150, which comprises a binary downconverter 202, an IF carrier recovery loop 162, a symbol clock recovery block 208, and the digital passband DQPSK detector 201.

The symbol clock recovery block 208 modifies the phase of the receive PN signal 216 so as to maximize the RSSI output 215, thereby aligning the phase of the receive PN signal 216 to that of the transmit PN signal 101. There is a predetermined relationship between the phase of the transmit PN signal and the transmitted symbol timing in the modulated IF carrier 108, and consequently a predetermined relationship between the receive PN signal 216 and the received symbol timing in the received modulated IF carrier 158. Therefore, the symbol clock timing block 208 may infer a recovered symbol clock 220 from the RSSI input 215. The symbol clock timing block 208 also generates an EVAL_WINDOW signal 302 and a bit-clock 218, described later. The master clock signal 230 provided to the receiver 150 is a high-frequency digital clock signal that clocks digital processing circuitry in the symbol clock recovery block 208 and all other digital circuits 202, 162, and 201 in the receiver 150.

The binary downconverter 202 is a discrete-amplitude, continuous-time circuit which downconverts the limited IF signal 159 from the first intermediate frequency to a receive signal 203 at a second, lower, intermediate frequency, preferably 460.7 kHz. The receive signal 203 can be described as a complex binary signal representing the polarity of a DQPSK-modulated carrier at the second intermediate frequency.

The IF recovery loop 162 recovers the frequency of the carrier in the receive signal 203 and produces two signals representing the recovered carrier 155I and a π/2 phase-shifted version of the carrier 155Q.

The passband DQPSK detector 201 recovers the data bits from the receive signal 203, given the symbol clock 220 and the recovered carrier signals 155I and 155Q. It generates the receive data output 152, which matches the transmitted data 102 except where reception errors occur.

Figure 2:
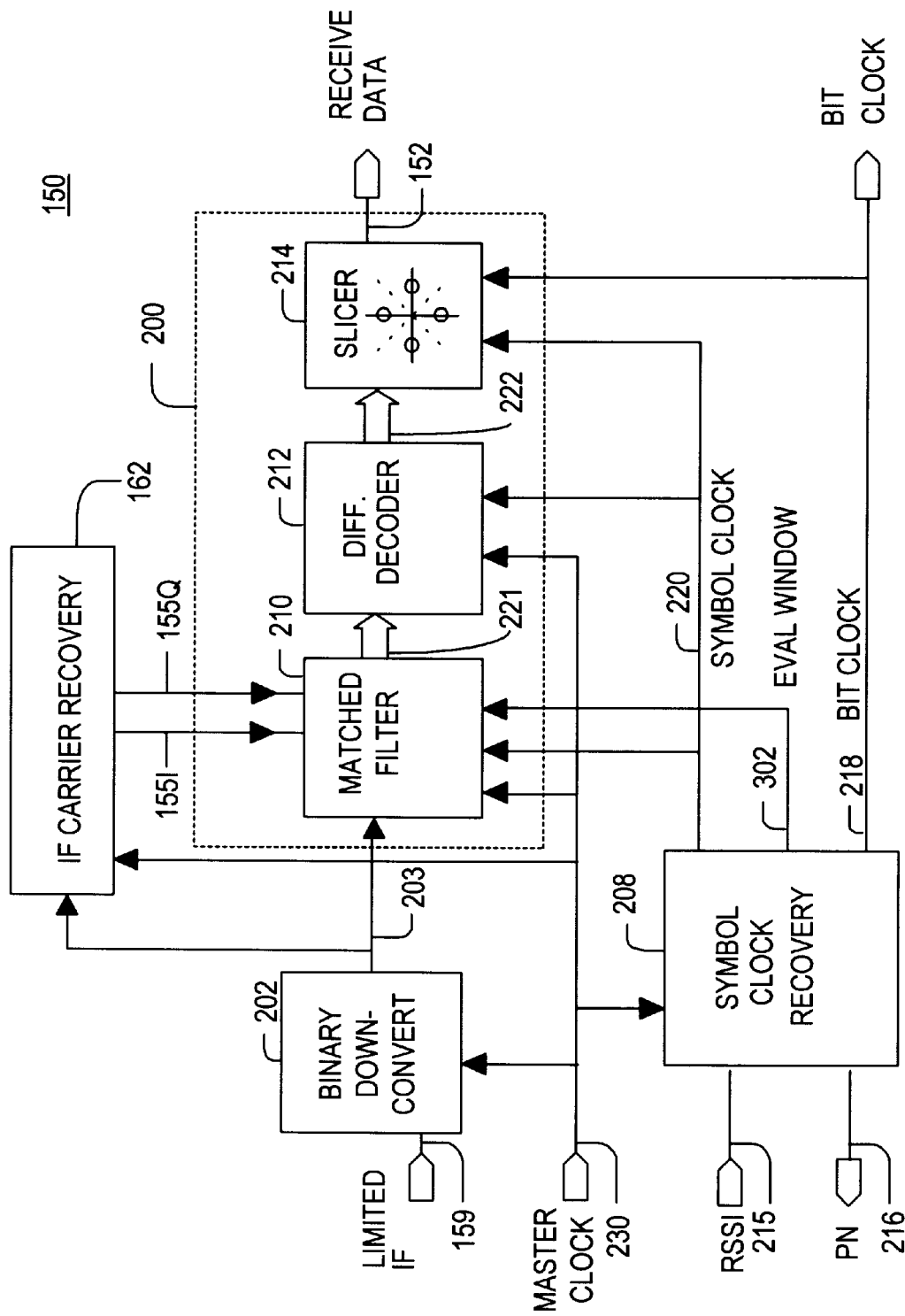
FIG. 2 is a general block diagram of one embodiment of a digital baseband receiver front end for a differentially encoded transmitted signal.

FIG. 2—Digital DQPSK Passband Receiver

Referring now to FIG. 2, there is shown a general block diagram of one embodiment of the digital passband DQPSK receiver 150. The digital passband DQPSK detector 201 in the receiver 150 includes a matched filter 210, a differential decoder 212, and a slicer 214 with novel configurations as described below.

As can be seen from FIG. 2, the digital passband DQPSK receiver 150 receives the limited IF signal 159 as an input and downconverts the received signal carrier frequency from 10.7 MHz to the receive signal 203 at the second IF, here chosen to be 460.7 kHz. This is achieved, in one embodiment of the receiver 150, by first converting the limited IF signal 159 to digital logic levels, then performing the Boolean exclusive OR (XOR) function with two operands, those operands being the result of the level conversion of the limited IF signal 159 and the binary digital output of a phase-locked loop driven by the master-clock and designed to produce 10.24 MHz, then passing the result through an analog low-pass filter to retain the 460 kHz product and reject the 20.94 MHz product. The output of the low-pass filter must be passed through a comparator to convert it to digital signal levels. The purpose of the downconversion is to allow adequate oversampling of the receive signal 203 by the master clock 230 in the matched filter 210 and the IF recovery loop 162.

The receive signal 203 can be described as a square wave toggling at the IF carrier frequency with phase constant over any given symbol duration and with rapidly changing phase near the symbol boundaries. The symbol clock recovery block 208 produces the symbol clock 220 coincident with the symbol boundaries in the receive signal 203. It derives the symbol clock 220 timing from the known phase of the receive PN signal 216 and a predetermined timing relationship between these two signals. This timing relationship is influenced by the group delay in the filter 164, the IF limiter 163, and the binary downconverter 202.

The received signal 203 is fed to the digital IF recovery loop 162, the purpose of which is to track the frequency of the IF carrier in the received signal 203. The high-frequency master clock 230 is the second input to the IF recovery loop and it clocks digital processing circuitry. The IF recovery loop tracks the IF carrier in the received signal 203 and is insensitive to the QPSK modulation imposed upon the carrier. The output 155I is a binary signal representing the polarity of the recovered IF carrier. The output 155Q is a binary signal representing the polarity of the recovered IF carrier phase-shifted by $\pi/2$, or, equivalently, multiplied by $-j$, where j is defined by $j=\sqrt{-1}$. Both output signals 155I and 155Q are discrete-time signals sampled at the master clock 230 sampling rate. Furthermore, the output signal 155I is preferably aligned in phase with any arbitrary $n\pi/2+\pi/4$ phase-shift of the actual IF carrier in the received signal 203 (n=0,1,2,3).

The digital matched filter 210 receives the receive signal 203. It also receives the symbol clock 220 from the symbol clock recovery block 208 and the recovered carrier signals 155I and 155Q from the IF carrier recovery loop 162. The digital matched filter is uniquely implemented in simple digital hardware as described in detail later. The digital matched filter correlates the received signal 203 against each of the recovered carrier waveforms 155I and 155Q and generates an output 221 indicative of the phase of the current symbol with respect to the recovered carrier. This output 221 is carried in a first predetermined number of bits. The EVAL_WINDOW signal 302 determines the correlation interval for each received symbol. The symbol clock 220 determines the sampling rate of the matched-filter output.

The differential decoder 212 produces a complex-valued output 222 indicating the phase difference between any two successive symbols. Its inputs are the complex-valued output 221 of the matched filter 210, the symbol clock 220, and the high frequency master clock 230 for performing digital calculations. The differential decoder performs the multiplication of the current matched filter output sample with the complex conjugate of the previous sample. The multiplication is preferably performed using serial multiplication techniques well-known in the art in order to reduce complexity of the digital hardware required for the calculation.

The slicer 214 receives the complex-valued output 222 from the differential decoder 212 and quantizes the signal 222 to generate the receive data signal 152, which is the output of the passband DQPSK receiver 150, at the bit rate indicated by the bit clock 218

Several technical advantages are achieved in the particular arrangement of the elements of the receiver 150. First, because the receiver 150 directly couples to the limited IF signal 159, all circuitry can be realized with digital logic, with the exception of comparators used to translate the signal levels of the limited IF signal 159 to digital logic levels. This is because the limited IF signal has only two voltage levels and therefore represents a binary-valued signal. All-digital realization improves manufacturability by making a design more repeatable and less sensitive to noise.

Second, the implementation of the matched filter 210 simultaneously filters, downconverts, and samples the receive signal 203, making it reliable and inexpensive. The EVAL_WINDOW signal 302 allows effective and inexpensive rejection of corruptive noise in the receive signal 203 caused by collapse of the IF envelope at symbol boundaries characteristic of band-limited PSK systems.

Third, the phasing of the recovered carrier signals 155I and 155Q maximizes the magnitude of the expected matched filter output 221 versus other recovered phase relationships.

Fourth, the matched filter is tolerant of any arbitrary phase of recovered carrier relative to the actual carrier of the receive signal 203. Phase shifts other than the target degrade performance of the receiver by reducing the magnitude of the expected matched filter output, but do not result in catastrophic failure. Therefore, the matched filter 210 can operate with degraded performance even when the IF carrier recovery loop 162 is not precisely tracking the IF carrier in the receive signal 203.

Fifth, the differential decoder operates at the comparatively slow symbol rate, allowing multiplication operations to be done using bit-serial arithmetic, reducing overall complexity in comparison to parallel multiplication techniques. An alternative receiver arrangement placing the symbol-to-symbol phase-differencing function of the differential decoder 212 before the matched filter would require significant memory to store samples of the receive signal 203 for an entire symbol period.

Furthermore, the output of the differential decoder contains a multi-bit representation of the symbol phase without loss of any of the correlation information obtained from the matched filter. Slicing is therefore performed in the slicer 214 using all of the available correlation information. Furthermore, the slicer is capable of completely isolating the slicing criterion, that is the symbol phase, from the differential decoder 212 output, rejecting magnitude modulation in the matched filter 210, which results from corruptive noise.

Finally, the configuration is easily adaptable to coherent QPSK or BPSK demodulation by removal of the differential decoder 212 and simple modification of the slicer 214 to remap output codes upon detection of a predetermined initialization sequence. It is further easily adaptable to DBPSK demodulation by a simple modification of the slicer 214 alone.

FIG. 3—Digital Matched Filter

Figure 3A:
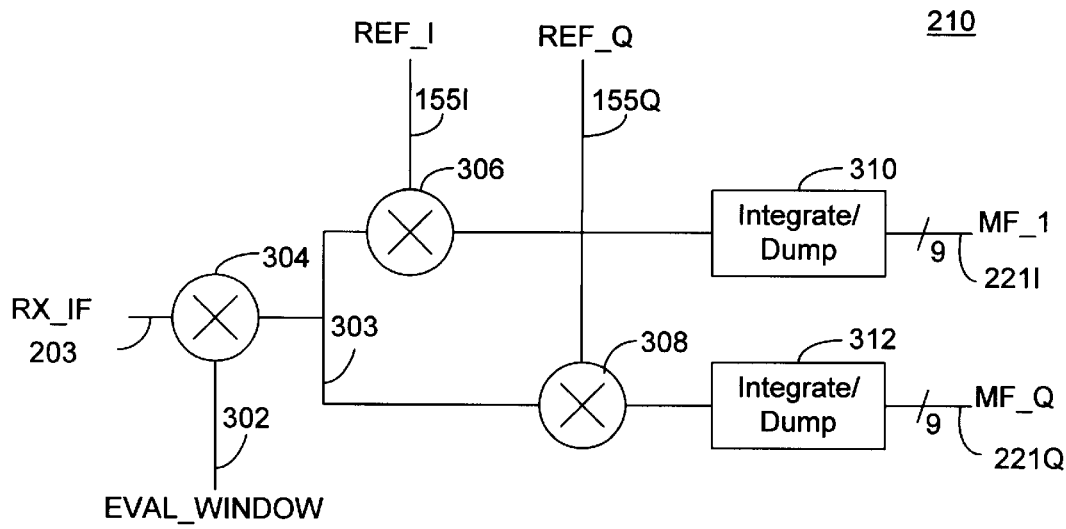
FIG. 3A is a block diagram representation of a correlation realization of a matched filter having a complex digital output.

Referring now to FIG. 3A, there is shown a block diagram representation of a correlation realization (from Equation 3 above) of the matched filter according to one embodiment. A first multiplier 304 multiplies the receive signal 203 by the EVAL_WINDOW signal 302, which is periodic in time, repeating at the symbol rate, and has a value of zero in the vicinity of symbol boundaries and unity elsewhere. The output 303 of the first multiplier 304 equals the receive signal except in the vicinity of symbol boundaries, where it is zero. A second multiplier 306 multiplies the first multiplier output 303 by a first carrier reference signal 155I, labeled REF_I, representing the first of two orthonormal basis vectors defining the signal space of the received signal 203, labeled RX_IF(t). A first integrate/dump circuit 3 10 integrates the resultant of the second multiplication over a symbol interval. The operation of an integrate/dump circuit is well-known in the art: the value of the integration is initialized to zero at the beginning of each symbol interval and the value of the integration at the end of each symbol interval is driven on the integrate/dump output 221I for the duration of the subsequent symbol interval. Therefore the output 221I of the first integrate/dump circuit 3 10 is a symbol-rate sampled signal described by $$\text{MF\_I}(k) = \text{MF\_I}(t)|_{t=kT}$$
$$= \int_{kT-T/2}^{kT+T/2} \text{EVAL\_WINDOW} \cdot \text{RX\_IF}(t) \cdot \text{REF\_I}(t) dt$$

and having the same form as Equation 3 above, known as a correlation. The third multiplier 308 and the second integrate/dump circuit 312 likewise function together to implement a correlation of the received signal 203 with a second carrier reference signal 155Q, labeled REF_Q, representing the second of two orthonormal basis vectors defining the signal space of the receive signal 203. The vector output of the matched filter (221I, 221Q) can therefore be written:

$$MF\_I(k) + jMF\_Q(k) = \qquad (Equation\ 4)$$
$$\int_{kT-T/2}^{kT+T/2} EVAL\_WINDOW \cdot RX\_IF(t) \cdot$$
$$(REF\_I(t) + jREF\_Q(t))dt$$

where the mapping of the signals REF_I and REF_Q to the complex plane is done as a convenient means of representing the two-dimensional orthonormal vector basis of the signal space of the receive signal 203. If the reference signals 155I and 155Q are chosen to be $\cos(\omega_{IF}t)$ and $-\sin(\omega_{IF}t)$ respectively, the form of Equation 4 is very similar to that of Equation 3, neglecting the scaling factor and the time window EVAL_WINDOW 302. Thus the MF_I signal 221I is the in-phase (real) component of the matched-filter output 221, and the MF_Q signal 221Q is the quadrature-phase (imaginary) component of the matched-filter output 221.

Multiplication of the receive signal 203 by the EVAL_WINDOW signal 302 is equivalent to further restricting the limits of integration so as to avoid inclusion of information having a high probability of being corrupted by noise. The EVAL_WINDOW signal 302 can be described by:

$$EVAL\_WINDOW(t) = \begin{cases} 1 & -T/2+t_0 \le t-kT \le T/2-t_0 \\ 0 & else \end{cases}$$

where $t_0$ is a parameter, preferably programmable, describing the width of interval excluded from evaluation. Equation 4 can be rewritten:

$$MF\_I(k) + jMF\_Q(k) = \int_{kT-T/2+t_0}^{kT+T/2-t_0} RX\_IF(t) \cdot \qquad (Equation\ 5)$$
$$(REF\_I(t) + jREF\_Q(t))dt$$

Figure 3B:
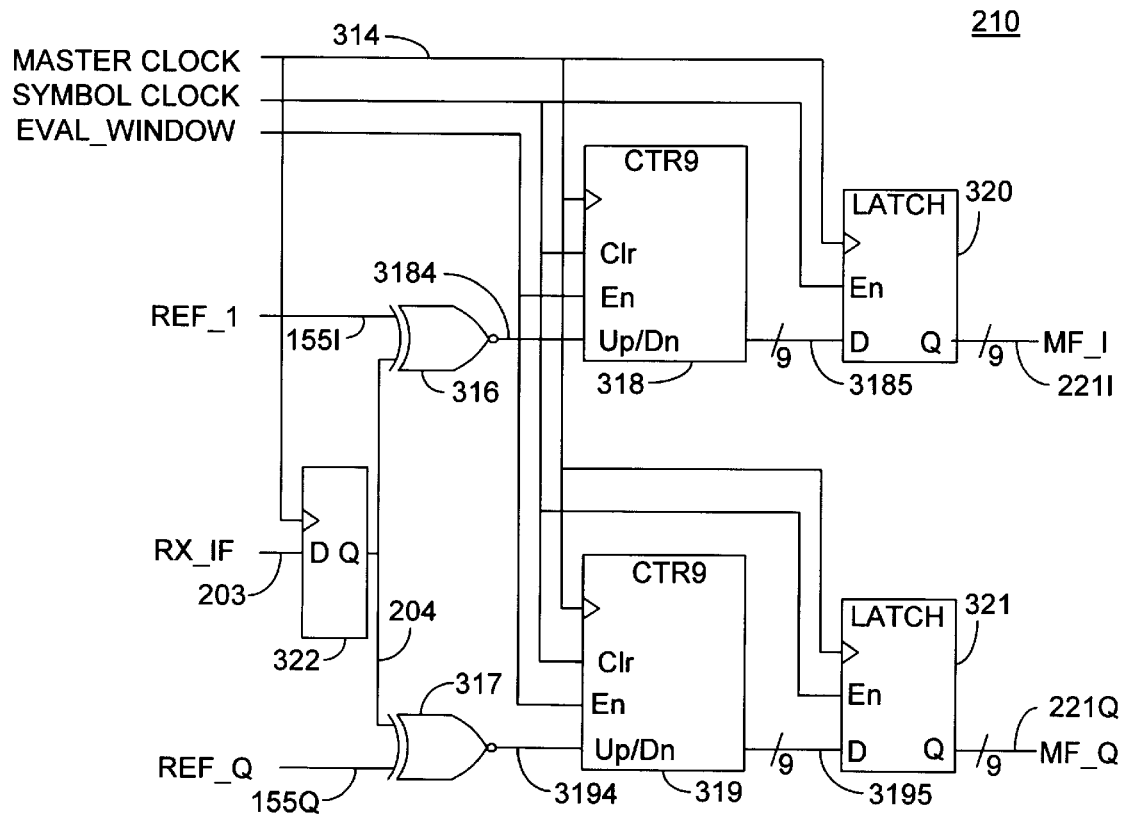
FIG. 3B shows an all-digital implementation of the matched filter block diagram in FIG. 3A resulting in a simple and flexible circuit design.

Now referring to FIG. 3B, a detailed digital implementation of the filter block diagram of FIG. 3A is shown. It is noted that the circuit in FIG. 3B employs commonly available simple digital circuit elements. This unique implementation of the matched filter 210 results in a very repeatable circuit design at low manufacturing cost. The implementation is in discrete time, and the function realized is a discrete-time translation of Equation 5:

$$MF\_I(k) + jMF\_Q(k) = \qquad (Equation\ 6)$$
$$\sum_{n=-\frac{N}{2}+m}^{\frac{N}{2}-1-m} RX\_IF\left(\frac{kn}{N}T\right)\left(REF\_I\left(\frac{kn}{N}T\right) + jREF\_Q\left(\frac{kn}{N}T\right)\right)$$

where k is the symbol-rate sample index, n is the sample index at the master clock rate during any given sample k, T is the symbol sampling period, T/N is the master clock sampling period, and m represents the evaluation time restriction caused by EVAL_WINDOW. Furthermore, the terms in the integrand are described as:

$$RX\_IF(n,k) = sgnm[\cos(\omega_{IF}t+\theta(t))]|_{t=knT/N} \qquad (Equation\ 7a).$$

$$REF\_I(n,k) = sgnm[\cos(\omega_{IF}t+\phi_0)]|_{t=knT/N} \qquad (Equations\ 7b).$$

$$REF\_Q(n,k) = -sgnm[\sin(\omega_{IF}t+\phi_0)]|_{t=knT/N}$$

where $\omega_{IF}$ is the radian frequency of the IF carrier, $\theta(t)$ is the phase modulation, $\phi_0$ is any arbitrary constant phase offset, preferably an integral multiple of $n\pi/2+\pi/4$ (n=0,1,2,3). The two reference signals 155I and 155Q form an orthogonal basis only if evaluated over an integral number of periods of the reference signal waveforms 155I or 155Q. In one embodiment, the symbol period T is set to 15.625 $\mu$s, the master clock rate is 15.36 MHz, N=240, $\omega_{IF}=2\pi \cdot 460,700$ radians/s. Therefore, setting m=20 makes the integration duration of 200 samples equal to 6 periods of the IF carrier, so that the evaluation window EVAL_WINDOW 302 subsumes an integral number of periods of the 460.7 kHz carrier. In this case, the resultant on MF_I and MF_Q outputs 221I and 221Q are described in the following table, where it can be seen that the outputs are placed orthogonally in the two-dimensional signal space. It may also be noted that although the table is written for the specific values of $\phi_0$ any arbitrary value of $\phi_0$ will yield values on M_I and MF_Q that sit on orthogonal vectors, those orthogonal vectors being a translation through phase of the real and imaginary axes of the defined orthogonal basis vectors REF_I and REF_Q. For example, note that for $\phi_0=0$ in Table 1, the expected MF_I and MF_Q values lie on a set of axes rotated $\pi r/4$ form the real and imaginary axes. It is also apparent from Table 1 that the magnitude of the vector described by MF_I and MF_Q is smaller by a factor of $\sqrt{2}$ for the $\phi_0=0$ case than for the other cases listed. This important result occurs as a direct consequence of the signum function being applied to each of the matched filter operands, as described in Equations 7a and 7b above. Since noise is uncorrelated to the reference signals 155I and 155Q and is therefore independent of the phase $\phi_0$ of the recovered carrier, the SNR at the matched filter output is maximized when the signal magnitude, (i.e. the magnitude of the vector (M_I, MF_Q) is maximized, which occurs when $\phi_0 \in \{\pi/4, 3\pi/4, 5\pi/4, 7\pi/4\}$.

TABLE 1

Example Matched Filter Outputs

| $\phi_0$ | $\theta(k)$ | MF_I(k) | MF_Q(k) |
| --- | --- | --- | --- |
| $\pi/4$ | $\pi/4$ | 200 | 0 |
| $\pi/4$ | $3\pi/4$ | 0 | −200 |
| $\pi/4$ | $5\pi/4$ | −200 | 0 |
| $\pi/4$ | $7\pi/4$ | 0 | 200 |
| $3\pi/4$ | $\pi/4$ | 0 | 200 |
| $3\pi/4$ | $3\pi/4$ | 200 | 0 |
| $3\pi/4$ | $5\pi/4$ | 0 | −200 |
| $3\pi/4$ | $7\pi/4$ | −200 | 0 |
| $5\pi/4$ | $\pi/4$ | −200 | 0 |
| $5\pi/4$ | $3\pi/4$ | 0 | 200 |
| $5\pi/4$ | $5\pi/4$ | 200 | 0 |
| $5\pi/4$ | $7\pi/4$ | 0 | −200 |
| $7\pi/4$ | $\pi/4$ | 0 | −200 |
| $7\pi/4$ | $3\pi/4$ | −200 | 0 |
| $7\pi/4$ | $5\pi/4$ | 0 | 200 |
| $7\pi/4$ | $7\pi/4$ | 200 | 0 |
| 0 | $\pi/4$ | 100 | −100 |
| 0 | $3\pi/4$ | −100 | −100 |

TABLE 1-continued

Example Matched Filter Outputs

| $\phi_0$ | $\theta(k)$ | MF_I(k) | MF_Q(k) |
|---|---|---|---|
| 0 | $5\pi/4$ | −100 | 100 |
| 0 | $7\pi/4$ | 100 | 100 |

In practical application of FIG. 3B, the frequency of the carrier may vary over time so that the interval bounded by the EVAL_SIGNAL is not an integral multiple of IF carrier periods and the resulting correlations are not conducted on truly orthogonal basis vectors. For small variations in carrier frequency, however, the error incurred is small.

In FIG. 3B, the input receive signal 203 is logically high when RX_EF(t) is +1 and logically low when RX_HF(t) is −1. Likewise the reference inputs 155I and 155Q are also logically high to represent +1 and logically low to represent −1. The flip-flop 322 exists to synchronize the input 203 to the master clock 230 sampling timing. Its output is the sampled receive signal 204. The reference inputs 155I and 155Q are assumed in this embodiment to be discrete-time signals sampled on the master clock 230 as well. The multiplier 306 in FIG. 3A is realized as a Boolean exclusive NOR (XNOR) gate 316, defined such that its output 3184 is high when its inputs are logically identical and low otherwise. The XNOR output 3184 is thus logically high to represent a +1 resultant of the multiplier 306 in FIG. 3A and logically low to represent −1.

The 9-bit counter 318 acts as the integrator in the integrate/dump circuit 310 of FIG. 3A. Upon each symbol clock 220, the counter output 3185 is cleared to zero. Upon each master clock pulse 230, the counter 318 increments if the XNOR gate output 3184 is logically high and decrements otherwise, thereby performing a discrete-time integration. Counting is inhibited when the EVAL_WINDOW signal 302 is logically low, thus performing the same function of setting the limits of integration as is performed by the multiplier 304 of FIG. 3A. Upon the next symbol clock pulse 220, the value accumulated in the counter 318 is latched in the register 320 and appears for the duration of the subsequent symbol interval at the register output 221I, labeled MF_I. Thus the counter 318 and register 320 perform a function equivalent to that of the integrate/dump circuit 310 of FIG. 3A.

Likewise, the XNOR gate 317 multiplies the sampled receive signal 204 by the REF_Q signal 155Q to generate the output 3194. This output is provided to the counter 319, which generates an output 3195. This output 3195 is provided to the register 321, which generates the register output 221Q, labeled MF_Q. Together, the counter 319 and the register 321 perform the integrate/dump function of the integrate/dump circuit 312 of FIG. 2A.

The 9-bit word width of the counters 318 and 319 is adequate to represent the maximum possible magnitude accumulated in either integrator, which is 200 in the preferred embodiment.

Referring now to the first counter 318, its clock input node receives the master clock signal 230. In the preferred embodiment, this master clock has a frequency of 15.36 MHZ. Any frequency which is substantially higher than the frequency of the received IF 203 (or, for that matter, of the reference signals 155I and 155Q) may be chosen. The counter 318 is evaluated at the frequency of the master clock 230. Hence, a substantially high frequency is preferred, depending on the counter hardware limitations. The higher the frequency of the master clock, the better will be the resolution of the received symbol's in-phase and quadrature components.

FIG. 4—Digital Differential Decoder

The differential decoder, as previously described, compares the phase of the most recently received data symbol contained in the received signal 203 to that of the previous data symbol, also contained in the same received signal 203. The differential decoder operation may be described mathematically by noting that a received symbol $[I_k+jQ_k]$ can be represented in polar coordinates as:

$$I_k+jQ_k=a_k e^{j\theta_k} \quad \text{(Equation 8)}$$

Where $I_k$ represents the magnitude and the sign of the in-phase component as given by the first set of bits 221I at the output of the first data latch 320. Similarly, $Q_k$ represents the magnitude and the sign of the quadrature-phase component of the currently received symbol as given by the matched filter output bits 221Q. In this notation, the complex conjugate of the immediately previously transmitted symbol would be:

$$I_{k-1}-jQ_{k-1}=a_{k-1}e^{-j\theta_{k-1}} \quad \text{(Equation 9)}$$

Multiplying Equations 8 and 9 and assuming that the magnitudes, $a_k$ and $a_{k-1}$, of the two received symbols remain approximately constant, we get:

$$(I_k+jQ_k)(I_{k-1}-jQ_{k-1})=a_k a_{k-1} e^{j(\theta_k-\theta_{k-1})}=a_k a_{k-1} e^{j(\Delta\theta_k)} \quad \text{(Equation 10)}$$

The phase $\Delta\theta_k$ is the recovered information content, and should be an element of the alphabet $\Omega\epsilon\{n\pi/2\}$, neglecting ISI (inter symbol interference) and noise.

The foregoing mathematically describes the differential decoder operation. This is generally modeled in FIG. 4A. As can be seen in that figure, the plurality of output bits 221 (FIG. 2) from the matched filter 210 are applied in parallel to a branched network comprising a digital multiplier 405 and a complex conjugate 401 and unit delay 403. This arrangement effectively performs the multiplication function (while preserving the sign of each set of input bits) as represented by the left hand side of the Equation 10. The result is a digital signal 222 carried in a second predetermined number of binary bits.

Figure 4A:
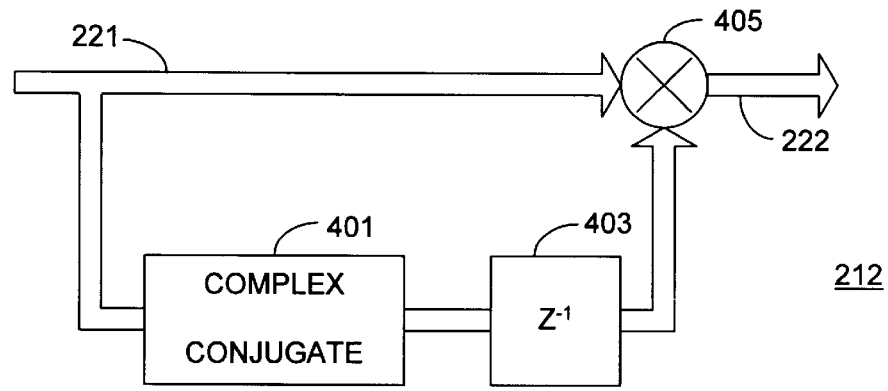
FIG. 4A is a mathematical model representation of a typical differential decoder operation.
Figure 4B:
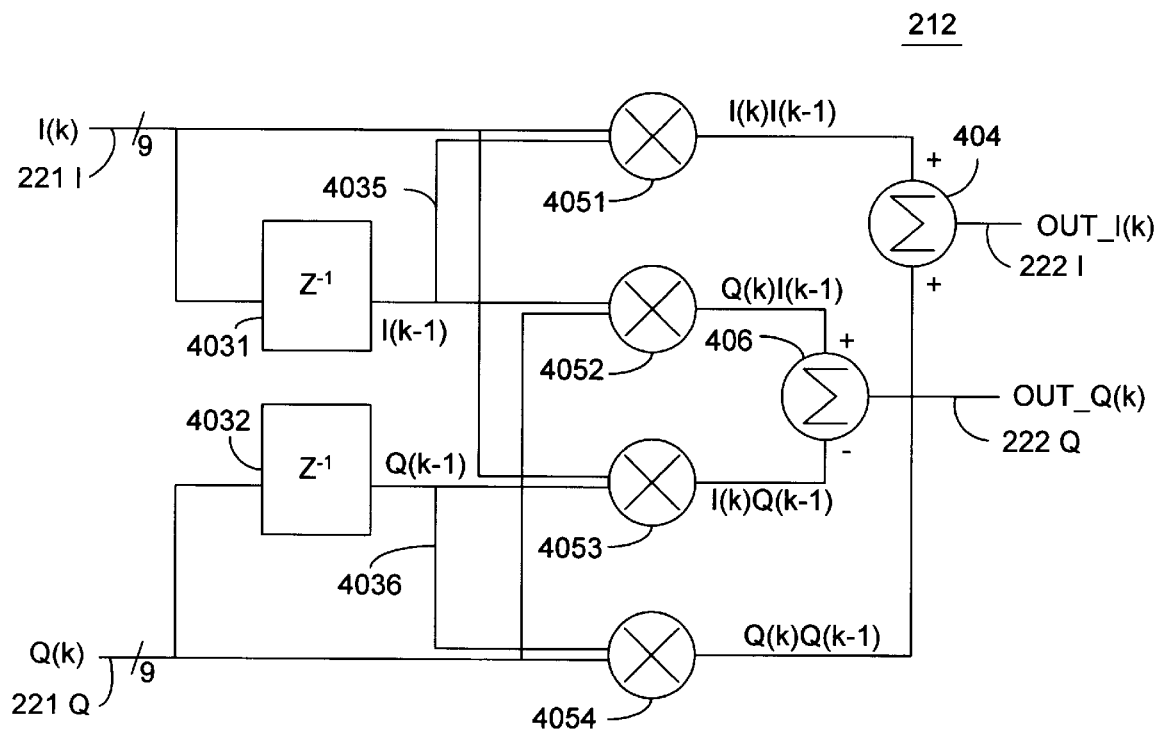
FIG. 4B shows a detailed implementation of the differential decoder model in FIG. 4A.

A detailed implementation of the model in FIG. 4A is shown in FIG. 4B. As was shown in FIG. 2, the differential decoder 212 also receives the symbol clock 220 from the symbol clock recovery circuit 208. This permits control over the delay period in the delay blocks 4031 and 4032, which implement the delay function of the unit delay 403. These delay blocks 4031 and 4032 receive the matched filter outputs 221I and 221Q. When the data latches 320 and 321 (of FIG. 3) latch the next set of bits from the matched filter counter outputs, the previous set of bits have been delayed by the delay units 4031 and 4032 in the digital differential decoder in such a way that the current set of matched filter output bits in signals 221I and 221Q and the previously delayed set of matched filter output bits 4035 and 4036 simultaneously appear at the input terminals of the multiplier 405 from FIG. 4A. This multiplier 405 is implemented in the four multiplication blocks 4051–4054 shown in FIG. 4B. The implementation is preferably done by using bit-serial arithmetic for the multiplication function, and by sharing the multiplier unit for all four multiplications, thereby reducing hardware complexity. Thus, the operation described by Equation 10 gets implemented in a simple way through digital hardware. Adders 404 and 406 in FIG. 4B perform the final addition dictated by the left hand side multiplication in Equation 10, generating the differential decoder outputs 222I and 222Q which comprise the second predetermined number of binary bits 222.

These binary bits 222 contain the necessary phase difference information, as represented by the right hand side in Equation 10. The magnitude and sign of real and imaginary components of the phase difference information signal are given by two sets of separate bit streams. The first set of bits 222I, generated by adder 404, conveys the indication of magnitude and sign of the real part of the complex output signal 222, and the second set of bits 222Q, generated by adder 406, conveys the indication of magnitude and sign of the imaginary part. As shown in FIG. 2, the plurality of bits of the complex digital output 222 from the digital differential decoder 212 are supplied to the slicer 214 to quantize and decode the recovered symbol.

Figure 5:
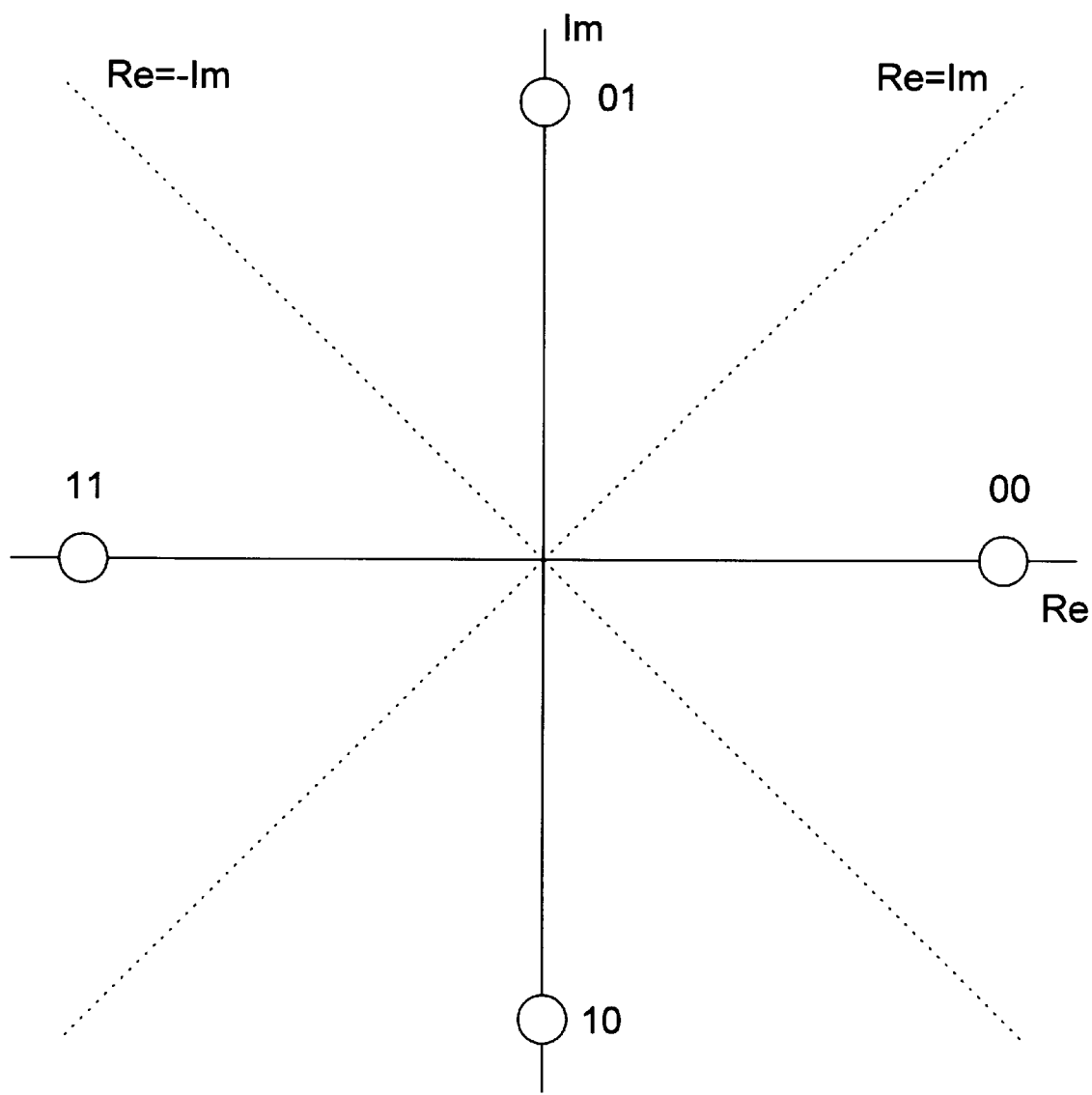
FIG. 5 illustrates a slicer input constellation and slicer thresholds for detecting binary bits in a received symbol.

FIG. 5—Digital Slicer

The slicer 214 quantizes the recovered differential symbol—as given by the two sets of bits (222I and 222Q) at the digital differential decoder output—into one of four dibit codes. In the present embodiment, two information bits were encoded into one DQPSK transmitted symbol. Hence, the slicer extracts those two bits per received symbol. But the same arrangement of digital matched filter, digital differential decoder and digital slicer may be employed to detect a single bit encoded into a transmitted DBPSK (differential binary-phase shift keying) symbol.

Referring now to FIG. 5, there is illustrated an expected slicer input constellation compared to signal 222 and threshold levels for detecting the pairs of binary bits as employed in the preferred embodiment. Other signal space constellations applicable to QPSK, BPSK, and DBPSK may be easily employed. The digital slicer rules for DQPSK are summarized in Table-2 below:

TABLE 2

| \|Re\| > \|Im\| | Sign (Re) | Sign (Im) | Output Code |
|---|---|---|---|
| True | Positive | X | 00 |
| True | Negative | X | 11 |
| False | X | Positive | 01 |
| False | X | Negative | 10 |

Earlier, it was mentioned with reference to Equation 10 that the phase $\Delta\theta_n$ is the recovered information content, and should be an element of the alphabet $\Omega\epsilon\{n\pi/2\}$, neglecting ISI (inter symbol interference) and noise. But, in practice, the phase difference between two consecutive received symbols might not be an integer multiple of $\pi/2$ because of noise received with the transmitted signal. Hence, the received symbol may not align to one of the four constellation points in FIG. 5. In such a case, a set of slicer rules has to be devised to reliably decode the encoded binary bits. One such set is given in the above Table-1. Based on the above, it is clear that the slicer would recover the encoded bits from received symbols affected with a small phase shift due to noise. In the preferred embodiment described by Table 1, the slicer rules are drawn to produce, in most cases, one bit error for each symbol error. The two-bit output code from the digital slicer 214 may be serialized and emitted MSB first (Most Significant Bit) on the rising edges of the bit clock from the symbol clock recovery circuit 208. The digital slicer 214 generates the binary receive data signal 152.

It is to be understood that multiple variations, changes and modifications are possible in the aforementioned embodiments of the invention described herein. Although certain illustrative embodiments of the invention have been shown and described here, a wide range of modification, change, and substitution is contemplated in the foregoing disclosure and, in some instances, some features of the present invention may be employed without a corresponding use of the other features. Accordingly, it is appropriate that the foregoing description be construed broadly and understood as being given by way of illustration and example only; the spirit and scope of the invention being limited only by the appended claims.

We claim:

1. In a communication receiver, a digital symbol detector for detection of PSK symbols in a limited passband received signal, said digital symbol detector comprising:

a signal input node to receive said received signal, wherein said received signal is a complex binary digital signal representing the output of an amplitude limiter driven by a carrier modulated with a series of phase-shift keyed complex-valued transmitted data symbols, wherein said complex binary digital signal comprises an in-phase component and a quadrature-phase component, wherein each of said series of transmitted data symbols comprises an in-phase component and a quadrature-phase component, wherein said in-phase component represents a real part of a transmitted signal, and wherein said quadrature-phase component represents an imaginary part of the transmitted signal, an input node for a symbol clock;

an input node for a bit clock;

an input node for a binary signal representing an arithmetic sign of a recovered carrier;

an input node for a binary signal representing an arithmetic sign of the recovered carrier phase-shifted by 90°;

a digital matched filter coupled to said signal input node, to said symbol clock input nodes, and to said recovered carrier input nodes, wherein said digital matched filter samples said received signal and generates a first predetermined number of binary bits therefrom per symbol clock period, and wherein said first predetermined number of binary bits conveys an indication of a magnitude and a sign of a correlation between the received signal and each of said in-phase and said quadrature-phase components of the recovered complex carrier sampled during a portion of an interval of said symbol clock;

a digital differential decoder coupled to said digital matched filter and to said said symbol clock input node, wherein said digital differential decoder receives said first predetermined number of binary bits and generates a second predetermined number of binary bits therefrom per symbol clock period, said second predetermined number of binary bits constituting a complex output indicating a phase difference between one of said series of transmitted data symbols and an immediately previous one of said series of transmitted data symbols, and wherein said complex output has a real component and an imaginary component; and a digital slicer coupled to said digital differential decoder and to said symbol clock input node and said bit clock input node, wherein said digital slicer performs a quantization of said second predetermined number of binary bits and recovers therefrom a pair of binary bits transmitted through said one of said series of transmitted data symbols.

2. The digital symbol detector as in claim 1, further comprising:

a digital carrier recovery loop coupled to said signal input node to receive said received signal as an input, wherein said digital carrier recovery loop generates a reference signal, wherein said reference signal is a complex binary signal with a period substantially equal to the period of said carrier, wherein said reference signal has a real component that aligns with a 0°, 90°, 180°, or 270° phase shift from the recovered carrier, and wherein said reference signal has an imaginary component that is shifted by 90° from said real component.

3. The digital symbol detector as in claim 2, wherein said digital carrier recovery loop further generates a shifted reference signal, wherein said shifted reference signal is a complex binary signal with a period substantially equal to the period of said carrier, wherein said shifted reference signal has a real component that aligns with a 45°, 135°, 225°, or 315° phase shift from the recovered carrier, and wherein said shifted reference signal has an imaginary component that is shifted by 90° from said real component.

4. The digital symbol detector as in claim 3, wherein said shifted reference signal is provided to phase detector in said carrier recovery loop.

5. The digital symbol detector as in claim 2, wherein said digital carrier recovery loop has a digitally-controlled digital oscillator (DCDO), wherein said DCDO is sampled at a clock rate of said matched filter.

6. The digital symbol detector as in claim 1, further comprising:

a digital carrier recovery loop coupled to said signal input node to receive said received signal as an input, wherein said digital carrier recovery loop generates a reference signal, wherein said reference signal is a complex binary signal with a period substantially equal to the period of said carrier, and wherein said reference signal is provided to said matched filter.

7. The digital symbol detector as in claim 1, further comprising a symbol clock timing circuit coupled to receive said received signal to generate a symbol clock therefrom, wherein said symbol clock has a rate equal to that of said plurality of transmitted data symbols.

8. The digital symbol detector as in claim 6, wherein said digital matched filter includes:

a counter to digitally sample said one of said series of transmitted data symbols by accumulating a count during a fraction of said interval of said symbol clock and by generating said first predetermined number of binary bits indicative of said count; and direction control means coupled to said counter, said direction control means generating a sign signal indicative of a match between said received signal and said reference signal, wherein a logic state of said sign signal is generated at a rate substantially equal to the counting rate of said counter, and wherein said logic state is applied to said counter, thereby controlling a direction of counting for said counter.

9. The digital symbol detector according to claim 8, said digital matched filter further comprising latching means coupled to said counter to latch said first predetermined number of binary bits.

10. The digital symbol detector as recited in claim 8, said direction control means comprising:

a first XNOR gate coupled to receive said received signal and an in-phase component of said reference signal as its inputs, wherein said first XNOR gate samples said received signal and an in-phase component of said reference signal at the counting rate of said counter; and a second XNOR gate coupled to receive said received signal and a quadrature-phase component of said reference signal as its inputs, wherein said second XNOR gate samples said received signal and said quadrature-phase component of said reference signal at the counting rate of said counter;

wherein outputs of said first and said second XNOR gates are applied to a direction control node of said counter.

11. The digital symbol detector according to claim 8, wherein said counter includes:

a first binary counter comprising:
a first counter clock input node to receive a master clock thereon, wherein a frequency of said master clock determines a rate of counting for said first counter,
a first counter enable input node configured to receive an Eval_Window signal thereon, wherein a duration of said Eval_Window signal determines said fraction of said symbol clock interval,
a first up/down control node coupled to a first output of said direction control means to determine a first count generated at said rate of counting, wherein said first count represents said magnitude and said sign of said in-phase component of said one of said plurality of transmitted data symbols integrated during said fraction of said symbol clock interval,
a first plurality of counter output nodes to convey said first count thereon through a first set of said first predetermined number of binary bits, and
a first counter clear input node to receive said symbol clock thereon, thereby resetting said first count at a rate equal to that of said plurality of transmitted data symbols; and a second binary counter comprising:
a second counter clock input node to receive said master clock thereon, wherein said frequency of said master clock determines said rate of counting for said second counter,
a second counter enable input node configured to receive said Eval_Window signal thereon, wherein said duration of said Eval_Window signal determines said fraction of said symbol clock interval,
a second up/down control node coupled to a second output of said direction control means to determine a second count generated at said rate of counting, said second count representing said magnitude and said sign of said quadrature-phase component of said one of said plurality of transmitted data symbols integrated during said fraction of said symbol clock interval,
a second plurality of counter output nodes to convey said second count thereon through a second set of said first predetermined number of binary bits, and
a second counter clear input node to receive said symbol clock thereon, thereby resetting said second count at said rate equal to that of said plurality of transmitted data symbols.

12. The digital symbol detector as in claim 9, wherein said latching means includes:

a first data latch comprising:
a first data clock input node coupled to receive a master clock thereon,
a first plurality of data input nodes coupled to a first plurality of output nodes of said counter to receive a first set of said first predetermined number of binary bits thereon, wherein said first set of said first predetermined number of binary bits represents said sign and said magnitude of said in-phase component of said one of said plurality of transmitted data symbols, a first plurality of data output nodes to maintain logic states of said first set of said first predetermined number of binary bits thereon, and a first data enable input node coupled to receive said symbol clock thereon, thereby latching said first set of said first predetermined number of binary bits for a maximum duration equal to said symbol clock period; and a second data latch comprising:

a second data clock input node coupled to receive said master clock thereon, a second plurality of data input nodes coupled to a second plurality of output nodes of said counter to receive a second set of said first predetermined number of binary bits thereon, wherein said second set of said first predetermined number of binary bits represents said sign and said magnitude of said quadrature-phase component of said one of said plurality of transmitted data symbols, a second plurality of data output nodes to maintain logic states of said second set of said first predetermined number of binary bits thereon, and a second data enable input node coupled to receive said symbol clock thereon, thereby latching said second set of said first predetermined number of binary bits for said maximum duration equal to said symbol clock period.

13. The digital symbol detector according to claim 11 or claim 12, wherein said frequency of said master clock is 15.36 MHz.

14. The digital symbol detector as in claim 11, wherein said duration of said Eval_Window signal is programmable.

15. The digital symbol detector according to claim 6, wherein said digital differential decoder is coupled to said digital matched filter to receive said first predetermined number of binary bits in parallel and includes a plurality of delay units, a plurality of multipliers and a plurality of adders to implement a digital multiplication according to the following:

$$(I_n + jQ_n)(I_{n-1} - jQ_{n-1})$$

wherein $I_n$ represents said magnitude and said sign of said in-phase component and $Q_n$ represents said magnitude and said sign of said quadrature-phase component of said one of said series of transmitted data symbols, wherein $I_{n-1}$ represents a magnitude and a sign of an in-phase component and $Q_{n-1}$ represents a magnitude and a sign of a quadrature-phase component of said immediately previous one of said series of transmitted data symbols, wherein said plurality of delay units provides a maximum delay equal to said symbol clock period to each of said first predetermined number of binary bits, wherein said digital multiplication is performed on said each of said first predetermined number of binary bits during said symbol clock period, and wherein said digital multiplication generates said second predetermined number of binary bits comprising:

a first set of bits conveying a magnitude and a sign of said real component of said complex output, and a second set of bits conveying a magnitude and a sign of said imaginary component of said complex output.

16. The digital symbol detector according to claim 1, wherein said slicer quantizes said second predetermined number of binary bits and recovers said pair of bits transmitted through said one of said plurality of transmitted data symbols in accordance with the following table, in which |Re| and |Im| represent said magnitudes of said real and said imaginary components of said complex output and Sign(Re) and Sign(Im) represent said signs of said real and said imaginary components of said complex output constituting said second predetermined number of binary bits:

| |Re| > |Im| | Sign (Re) | Sign (Im) | Output Code |
| --- | --- | --- | --- |
| True | Positive | X | 00 |
| True | Negative | X | 11 |
| False | X | Positive | 01 |
| False | X | Negative | 10. |

17. In a communication system, a digital matched filter in a digital baseband digital symbol detector, wherein said digital matched filter is configured to digitally sample an amplitude-limited passband received signal and to generate a first predetermined number of binary bits therefrom, wherein said received signal is a complex binary digital signal representing the output of an amplitude-limiter driven by a carrier wave modulated with a series of phase-shift keyed complex-valued transmitted data symbols, wherein each of said series of transmitted data symbols contains an in-phase and a quadrature-phase component, wherein said in-phase component represents a real part of a transmitted signal, and wherein said quadrature-phase component represents an imaginary part of said transmitted signal, said digital matched filter comprising:

a counter to digitally sample one of said series of transmitted data symbols by accumulating a count during a fraction of a symbol clock interval and by generating said first predetermined number of binary bits indicative of said count, wherein a duration of the symbol clock interval is substantially equal to a duration of each of said series of transmitted data symbols; and direction control means coupled to said counter, said direction control means generating a sign signal indicative of a match between said received signal and an reference signal, wherein said reference signal has a frequency substantially equal to that of said received signal, wherein a logic state of said sign signal is generated at a rate substantially equal to said frequency of said received signal, and wherein said logic state is applied to said counter, thereby controlling a direction of counting for said counter;

wherein said direction control means comprises:

a first XNOR gate coupled to receive said received signal and an in-phase component of said reference signal as its inputs, wherein said first XNOR gate samples said received signal and an in-phase component of said reference signal at the counting rate of said counter; and a second XNOR gate coupled to receive said received signal and a quadrature-phase component of said reference signal as its inputs, wherein said second XNOR gate samples said received signal and said quadrature-phase component of said reference signal at the counting rate of said counter;

wherein outputs of said first and said second XNOR gates are applied to a direction control node of said counter.

18. The digital matched filter according to claim 17, wherein said counter includes:
a first binary counter comprising:
- a first counter clock input node to receive a master clock thereon, wherein a frequency of said master clock determines a rate of counting for said first counter,
- a first counter clear input node to receive a symbol clock thereon, said symbol clock having a rate equal to that of said plurality of transmitted data symbols,
- a first counter enable input node configured to receive an Eval_Window signal thereon, wherein a duration of said Eval_Window signal is equal to a fraction of said symbol clock interval, and wherein said duration of said Eval_Window signal determines a sampling period for said received signal,
- a first up/down control node coupled to an output of said first XNOR gate to determine a first count generated at said rate of counting, said first count representing a magnitude and a sign of said in-phase component contained in one of said plurality of transmitted data symbols integrated during said fraction of said symbol clock interval, and
- a first plurality of counter output nodes to convey said first count thereon through a first set of said first predetermined number of binary bits;

a second binary counter comprising:
- a second counter clock input node to receive said master clock thereon, wherein said frequency of said master clock determines said rate of counting for said second counter,
- a second counter enable input node configured to receive said Eval_Window signal thereon, wherein said duration of said Eval_Window signal is equal to said fraction of said symbol clock interval,
- a second up/down control node coupled to an output of said second XNOR gate to determine a second count generated at said rate of counting, said second count representing a magnitude and a sign of said quadrature-phase component contained in said one of said plurality of transmitted data symbols integrated during said fraction of said symbol clock interval,
- a second plurality of counter output nodes to convey said second count thereon through a second set of said first predetermined number of binary bits, and
- a second counter clear input node to receive said symbol clock thereon, thereby resetting said second counter at said rate equal to that of said plurality of transmitted data symbols.

19. The digital matched filter as recited in claim 18, further comprising latching means coupled to said first and said second binary counters to latch said first and said second sets of said first predetermined number of binary bits.

20. The digital matched filter as in claim 19, wherein said latching means includes:
a first data latch comprising:
- a first data clock input node coupled to receive said master clock thereon,
- a first plurality of data input nodes coupled to said first plurality of counter output nodes to receive said first set of said first predetermined number of binary bits thereon,
- a first plurality of data output nodes to maintain logic states of said first set of said first predetermined number of binary bits thereon, and
- a first data enable input node coupled to receive said symbol clock thereon, thereby latching said first set of said first predetermined number of binary bits for a maximum duration equal to said symbol clock period; and a second data latch comprising:
- a second data clock input node coupled to receive said master clock thereon,
- a second plurality of data input nodes coupled to said second plurality of counter output nodes to receive said second set of said first predetermined number of binary bits thereon, and
- a second plurality of data output nodes to maintain logic states of said second set of said first predetermined number of binary bits thereon, and
- a second data enable input node coupled to receive said symbol clock thereon, thereby latching said second set of said first predetermined number of binary bits for said maximum duration equal to said symbol clock period.

21. The digital matched filter according to claim 18 or 20, wherein said frequency of said master clock is 15.36 MHz.

22. The digital matched filter as in claim 18, wherein said duration of said Eval_Window signal is programmable.

23. In a communication receivers, a digital symbol detector for detection of a received signal, wherein said received signal is a complex binary digital signal representing the output of an amplitude limiter driven by a carrier modulated with a series of phase-shift keyed complex-valued transmitted data symbols, wherein each of said series of transmitted data symbols comprises an in-phase and a quadrature-phase component, wherein said in-phase component represents a real part of a transmitted signal, wherein said quadrature-phase component represents an imaginary part of said transmitted signal, and wherein each of said series of transmitted data symbols has a predetermined duration, a method of digitally implementing a matched filter in said detector, the method comprising:

(a) clearing a first binary counter and a second binary counter at the beginning of a symbol interval;

(b) applying a first binary signal representing the arithmetic sign of an in-phase component of a recovered carrier along with said received signal to said first binary counter so as to control a first direction of counting for said first binary counter, wherein said first binary signal has a frequency substantially equal to that of the carrier of said received signal;

(c) further applying a second binary signal representing the arithmetic sign of a quadrature-phase component of said recovered carrier along with said received signal to said second binary counter so as to control a second direction of counting for said second binary counter, wherein said second binary signal has a frequency substantially equal to that of the carrier of said received signal;

(d) clocking said first and second binary counters with a master clock having a predetermined frequency higher than that of the carrier of said received signal;

(e) configuring said first and said second binary counters to count at said predetermined frequency of said master clock for a duration less than or equal to said predetermined duration of each of said series of transmitted data symbols, thereby digitally sampling one of said series of transmitted data symbols contained in said received signal;

(f) further configuring said first and said second binary counters to output a plurality of bits representing a magnitude and a sign of an in-phase and a quadrature-phase components contained in said one of said series of transmitted data symbols; and (g) repeating steps (a) through (f) until said each of said series of transmitted data symbols in said received signal is sampled.

* * * * *

UNITED STATES PATENT AND TRADEMARK OFFICE
CERTIFICATE OF CORRECTION

PATENT NO. : 6,055,281

DATED : April 25, 2000

INVENTOR(S) : Hendrickson et al.

It is certified that error appears in the above-identified patent and that said Letters Patent is hereby corrected as shown below:

In the Claims:

Claim 23, col. 24, line 20, please delete "receivers" and substitute --receiver--.

Signed and Sealed this

Sixth Day of March, 2001

Attest:

NICHOLAS P. GODICI

Attesting Officer     Acting Director of the United States Patent and Trademark Office